United States Patent
Basol

(10) Patent No.: US 8,153,889 B2
(45) Date of Patent: Apr. 10, 2012

(54) ROLL-TO-ROLL INTEGRATION OF THIN FILM SOLAR MODULES

(75) Inventor: Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 0 days.

(21) Appl. No.: 12/018,147

(22) Filed: Jan. 22, 2008

(65) Prior Publication Data
US 2008/0196756 A1    Aug. 21, 2008

Related U.S. Application Data

(60) Provisional application No. 60/886,083, filed on Jan. 22, 2007.

(51) Int. Cl.
*H01L 31/0224* (2006.01)

(52) U.S. Cl. ........ 136/256; 136/243; 136/244; 136/251; 136/262; 136/264; 136/265

(58) Field of Classification Search ........... 136/243–265
See application file for complete search history.

(56) References Cited

U.S. PATENT DOCUMENTS

| | | | |
|---|---|---|---|
| 4,518,815 A | 5/1985 | Yamazaki | |
| 4,590,327 A | 5/1986 | Nath et al. | |
| 4,697,041 A | 9/1987 | Okaniwa | |
| 4,879,251 A * | 11/1989 | Kruehler et al. | 438/80 |
| 5,453,134 A | 9/1995 | Arai et al. | |
| 6,444,899 B2 | 9/2002 | Kubota | |
| 6,974,976 B2 * | 12/2005 | Hollars | 257/184 |
| 7,276,658 B2 | 10/2007 | Dubbeldam | |
| 2002/0166580 A1 | 11/2002 | Bauman et al. | |
| 2005/0272263 A1 | 12/2005 | Brabec et al. | |
| 2006/0157103 A1 | 7/2006 | Sheats et al. | |

OTHER PUBLICATIONS

International Search Report issued Jun. 27, 2008 in corresponding PCT/US08/51701.

* cited by examiner

*Primary Examiner* — Basia Ridley
*Assistant Examiner* — Christina Chern
(74) *Attorney, Agent, or Firm* — Pillsbury Winthrop Shaw Pittman LLP

(57) ABSTRACT

A photovoltaic module which has at least two solar cells, and a method and system to manufacture such photovoltaic modules. The solar cells are disposed on a surface of an insulating carrier film and an isolation structure is formed between the solar cells to electrically isolate them. A conductor structure such as conductive fingers and busbars is formed on the module. The fingers are formed substantially on the top transparent conductive layer of the cells and the busbar is formed substantially over the insulation structure. The busbar electrically connects the top transparent conductive layer of one of the cells to the conductive base of the other cell.

7 Claims, 5 Drawing Sheets

ROLL-TO-ROLL INTEGRATION OF THIN FILM SOLAR MODULES

This application claims priority to U.S. Provisional Application No. 60/886,083 filed Jan. 22, 2007 entitled "Roll-To-Roll Integration of Thin Film Solar Modules," which application is expressly incorporated by reference herein.

BACKGROUND

1. Field of the Invention

The present invention relates to thin film solar cell modules and methods of manufacturing them.

2. Description of the Related Art

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods. Group IIB-VIA compounds such as CdTe, Group IBIIIAVIA compounds and amorphous Group IVA materials such as amorphous Si and amorphous Si alloys are important thin film materials that are being developed.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{(1-x)}Ga_x(S_ySe_{(1-y)})_k$, where $0 \leq x \leq 1$, $0 \leq y \leq 1$ and k is approximately 2, have already been employed in solar cell structures that yielded conversion efficiencies approaching 20%. Among the family of compounds, best efficiencies have been obtained for those containing both Ga and In, with a Ga amount in the 15-25%. Recently absorbers comprising Al have also been developed and high efficiency solar cells have been demonstrated using such absorbers.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a substrate 11, such as a sheet of glass, a sheet of metal, an insulating foil or web, or a conductive foil or web. The absorber film 12, which comprises a material in the family of $Cu(In,Ga,Al)(S,Se,Te)_2$, is grown over a conductive layer 13 or a contact layer, which is previously deposited on the substrate 11 and which acts as the electrical ohmic contact to the device. The most commonly used contact layer or conductive layer in the solar cell structure of FIG. 1 is Molybdenum (Mo). If the substrate itself is a properly selected conductive material such as a Mo foil, it is possible not to use a conductive layer 13, since the substrate 11 may then be used as the ohmic contact to the device. The conductive layer 13 may also act as a diffusion barrier in case the metallic foil is reactive. For example, foils comprising materials such as Al, Ni, Cu may be used as substrates provided a barrier such as a Mo layer is deposited on them protecting them from reaction with Se or S as well as with the other components of the material such as Cu, In and Ga.

After the absorber film 12 is grown, a transparent layer 14 such as a CdS, ZnO or CdS/ZnO stack is formed on the absorber film. Radiation 15 enters the device through the transparent layer 14. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the $Cu(In,Ga,Al)(S,Se,Te)_2$ absorber film, and finally forming an ohmic contact to the device by a conductive layer. In this superstrate structure light enters the device from the transparent superstrate side. A variety of materials, deposited by a variety of methods, can be used to provide the various layers of the device shown in FIG. 1.

Thin film photovoltaic devices may be manufactured in the form of monolithically integrated modules where electrical interconnection of individual solar cells is achieved on a single substrate, such as a glass sheet, during the film deposition through repeated "scribing/depositing" steps and a module on a single substrate may be obtained. Alternatively thin film solar cells may be manufactured individually, physically separate from each other, and then connected in series, through use of soldering or conductive epoxies (as in standard Si solar cells) to obtain high voltage modules. In this case, solar cells often need to be large area, one dimension being more than 1", typically more than 3". Such large area requires deposition of finger patterns over the top conducting layer of the solar cell, such as the transparent layer 14 in FIG. 1.

Roll-to-roll or reel-to-reel fabrication of CIGS(S) type solar cells is attractive because of cost lowering potential and ease of manufacturing. In such an approach the CIGS(S) device structure of FIG. 1 may be formed on a conductive foil substrate such as a stainless steel or aluminum substrate, in a roll-to-roll fashion, and then individual solar cells may be cut from the roll which may be 0.3-1.2 meters (m) wide and 150-900 m long (approximately 1-4 ft wide and 500-3000 ft long). The cut cells may then be interconnected and packaged into modules. This interconnection step of prior-art approaches is labor intensive and complex and involves handling of a large number of individual solar cells. Present invention aims to simplify the interconnection process and reduce cost.

SUMMARY OF THE INVENTION

A photovoltaic module which has at least two solar cells, and a method and system to manufacture such photovoltaic modules. The solar cells are disposed on a surface of an insulating carrier film and an isolation structure is formed between the solar cells to electrically isolate them. A conductor structure such as conductive fingers and busbars is formed on the module. The fingers are formed substantially on the top transparent conductive layer of the cells and the busbar is formed substantially over the insulation structure. The busbar electrically connects the top transparent conductive layer of one of the cells to the conductive base of the other cell.

DESCRIPTION

Figure 1:
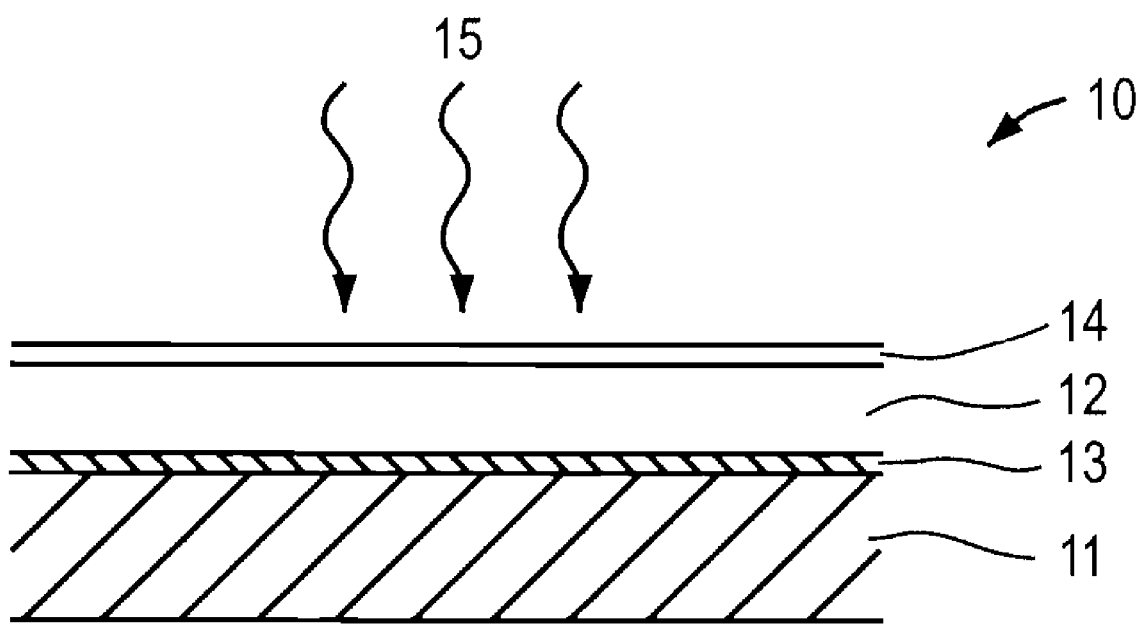
FIG. 1 is a cross-sectional view of a solar cell employing a Group IBIIIAVIA absorber layer.
Figure 2:
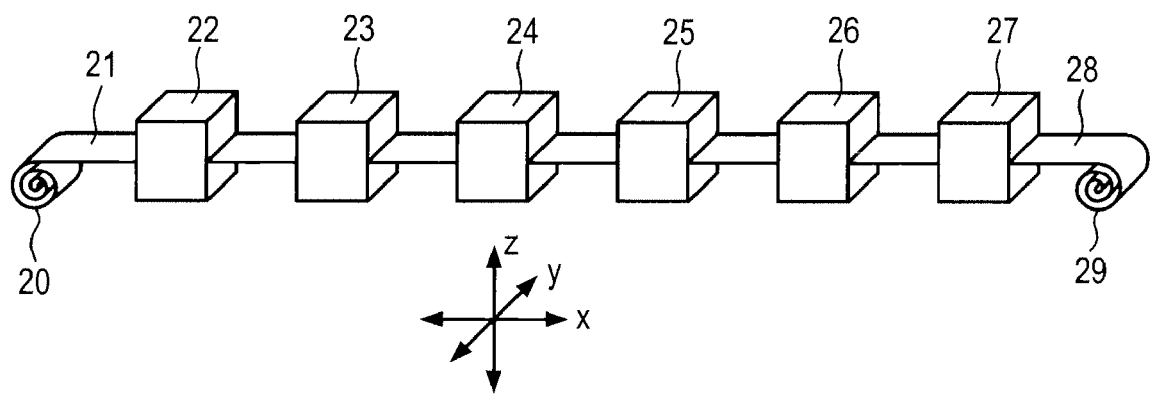
FIG. 2 is a roll-to-roll system to integrate thin film solar cells fabricated on a flexible conductive substrate.

The present invention provides a method and system to manufacture photovoltaic modules including at least two solar cells. Initially, a large piece, such as a roll of solar cell structure including a base and a stack formed on a base is formed. The stack includes an absorber layer formed on the base, a buffer layer formed on the absorber layer and a transparent conductor formed on the buffer layer. The individual cells including the stack and the base portion are cut or slit from the roll. The solar cells are disposed on a surface of a carrier film and an isolation structure is formed between the solar cells to electrically isolate them. In the following step a conductor structure such as conductive fingers and busbars is formed on the module. In one embodiment, busbars are formed over the isolation structures while the conductive fingers are extended over the transparent conductive surfaces. Placing busbars on the isolation structures increases solar efficiency. FIG. 2 schematically shows a roll-to-roll module interconnection approach and apparatus for CIGS(S) solar cells fabricated on a conductive foil substrate. A supply spool 20 provides a PV foil 21 to various process stations such as a cutting station 22 or slitting station, an attachment station 23, an insulation station 24, a scribing station 25, a finger deposition station 26 and an isolation station 27. The integrated foil 28 is then rolled onto a receiving spool 29.

Figure 3:
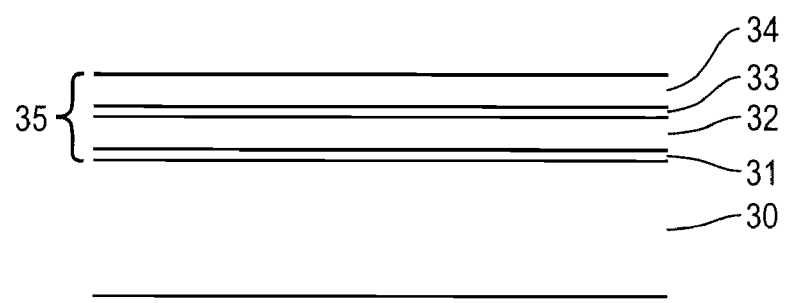
FIG. 3 is a cross-sectional view of an exemplary PV foil.

FIG. 3 shows a cross-sectional view of the PV foil 21 taken along "x" direction indicated in FIG. 2. In one embodiment of the present invention the PV foil 21 comprises a conductive foil substrate 30, a conductive back electrode 31, a CIGS(S) absorber layer 32, a buffer layer 33 and a transparent conductive film 34. The CIGS(S) absorber layer 32, the buffer layer 33 and the transparent conductive film 34 form a top stack 35. As an example, the conductive foil substrate 30 may be a stainless steel or aluminum based metallic foil. The conductive back electrode 31 may comprise a single or multi layer structure containing at least one of Cr, Mo, Ta, W, Ru, Ir, and Os. The CIGS(S) absorber layer 32 may be a layer grown by at least one of the various techniques including but not limited to solution growth (such as electroplating or ink deposition) methods or vacuum-based methods (such as evaporation and sputtering). The buffer layer 33 may comprise one of the buffer layer materials well known in the field such as CdS, ZnS, Cd—Zn—S, ZnSe, In—S, Ga—S, In—O—S etc. The transparent conductive film 34 may comprise a transparent conductive oxide such as ZnO, ITO or a solution deposited transparent conductive layer or both as more fully described in U.S. Provisional Application 60/886,078, filed Jan. 22, 2007 entitled "Finger Pattern Formation For Thin Film Solar Cells", which is expressly incorporated by reference herein.

Figure 4:
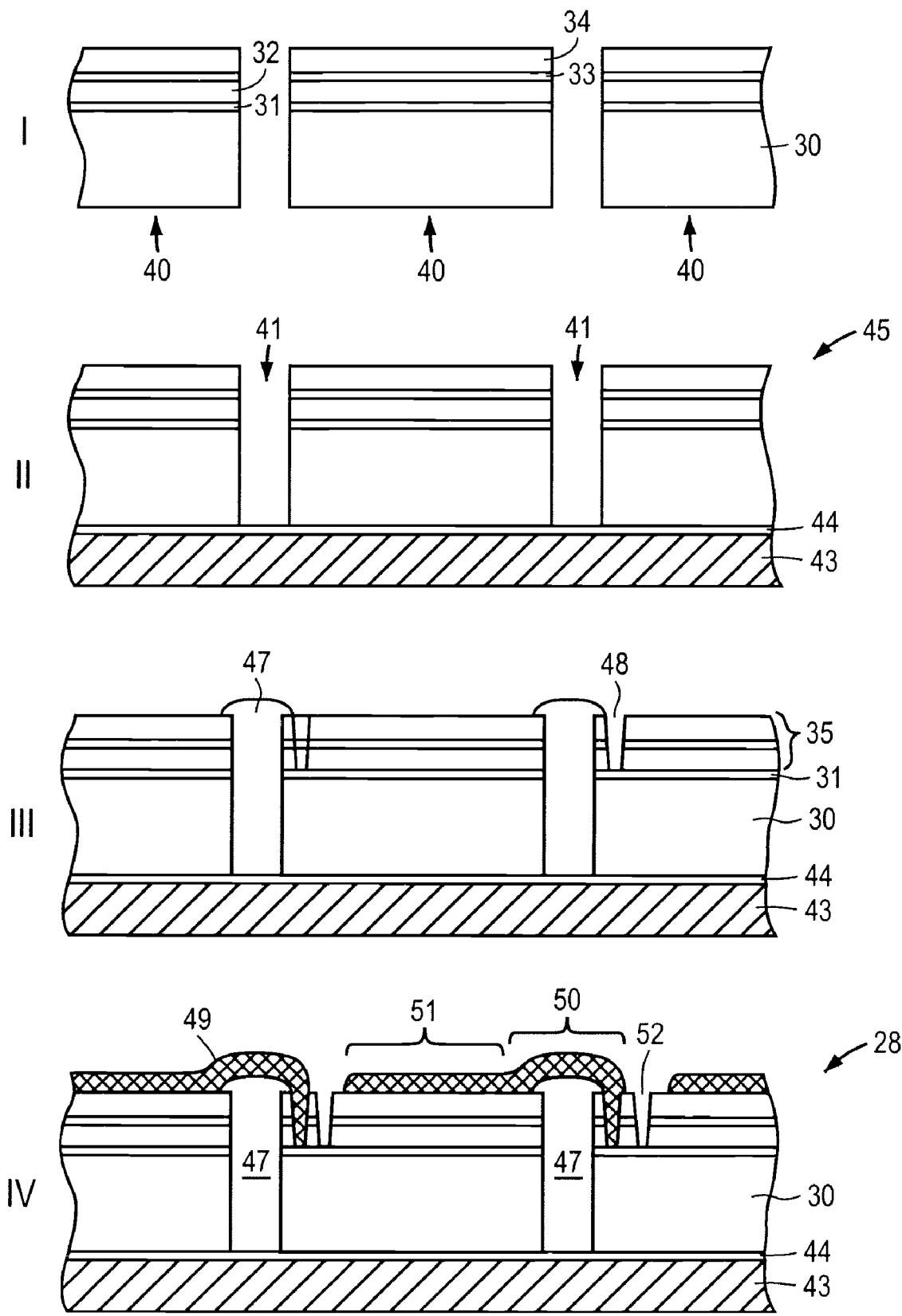
FIG. 4 shows the process steps of integration.

FIG. 4 shows a process sequence of the present invention for converting the PV foil 21 of FIG. 3 into the integrated foil 28. The cross-sectional views in FIG. 4 are taken along the width of the foil substrate 30, i.e. along the "y" direction shown in FIG. 2. In step I of the process the PV foil 21 is cut or slit into individual device segments 40. This cutting procedure may be performed in the cutting station 22 of FIG. 2 using mechanical cutting means or laser scribers as the PV foil is continuously moved from left to right. Alternately cutting procedure and all the other steps of the integration process of FIG. 2 may be carried out in step-wise manner, i.e. the PV foil 21 may be moved by a certain amount from left to right, processes may be applied at different stations onto the moved portion while the PV foil is stationary and then the foil may again be moved.

In step II of the process of FIG. 4 the device segments 40 are attached onto a carrier 43 through an adhesive layer 44 forming a composite foil 45 comprising device segments 40 separated by a gap 41. This attachment process may be carried out in an attachment station 23 (see FIG. 2) where the carrier 43 with an adhesive layer 44 over it may be provided from a roll within the attachment station 23. The carrier 43 may be made of any flexible insulating material such as a polymeric material with a thickness in the range of 10-250 micrometers (μm), preferably 25-100 μm. The width of the gaps 41 may be in the range of 10-500 μm, preferably in the range of 25-200 μm. It should be noted that the CIGS(S) formation process usually involves high temperatures in the range of 400-600° C. Since the composite foil 45 of FIG. 4 comprises the CIGS (S) layer, the temperature rating of the materials constituting the composite foil 45 do not need to be very high. A temperature rating of up to about 150° C. would be adequate.

In the step III of the present process an electrical insulator 47 is filled into the gaps 41, while an opening 48 is formed through the top stack 35 to the conductive back electrode 31 and the conductive foil substrate 30. Filling of the electrical insulator 47 into the gaps 41 may be achieved by injecting an insulating solution, paste or an ink into the gaps 41 as the composite foil 45 is moved, or by inserting a body of insulating material, such as wires or ribbons (not shown) into the gaps 41. The inks or pastes may be cured by UV radiation. The material of the wires or ribbons may be a thermoplastic material so that after inserting and heating it may substantially fill the gaps 41. There may also be adhesive within the gaps 41 and/or on the wires to keep them within the gaps 41 after insertion. This insulation step of the process may be carried out within the insulation station 24 of the system shown in FIG. 2. Formation of the opening 48 may be achieved by mechanical scribing or laser scribing, and this process step may be carried out either as the insulation step is being carried out or after or even before the insulation step is carried out. The system in FIG. 2 shows the step of formation of opening 48 to be carried out after the insulation step using a scribing station 25.

Figure 5:
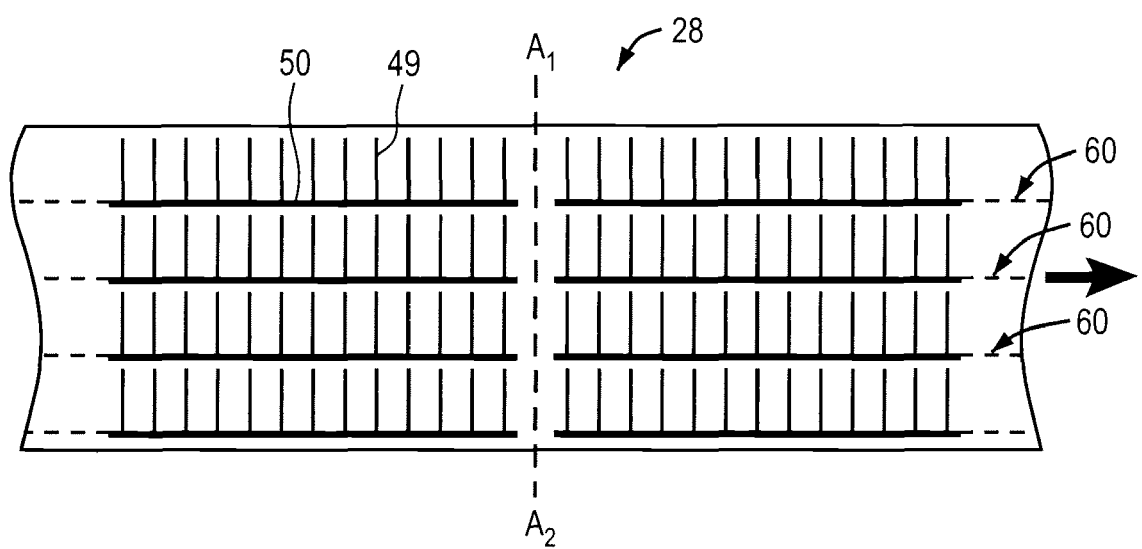
FIGS. 5 and 5A show the top view of a section of an integrated foil.

Step IV involves deposition of a finger pattern 49 comprising a busbar portion 50 and a finger portion 51 as shown in FIG. 4. The busbar portion 50 is preferably substantially over the electrical insulator 47 and it electrically shorts to the back electrode 31 and the conductive foil substrate 30 of the adjacent device section through the opening 48. By aligning with the electrical insulator 47, the busbar portion 50 does not cause excessive optical losses in the overall device in addition to the losses due to the presence of the gaps 41. Finger patterns 49 may be deposited by various means including screen printing and stamping as described more fully in U.S. Provisional Application 60/886,078 filed Jan. 22, 2007 entitled "Finger Pattern Formation For Thin Film Solar Cells". Such deposition may be carried out in a roll-to-roll manner in the finger deposition station 26 of FIG. 2. The last procedure of the process is an isolation process which may be carried out in the isolation station 27 as shown in FIG. 2 or may be achieved at the same time as the finger patterns 49 are deposited. The isolation process may be a scribing process that forms isolation cuts 52 and results in the series electrical connection of each device segment 40 on the now integrated foil 28. A top view of an exemplary integrated foil 28 with four solar cells connected in series is shown in FIG. 5. The integrated foil 28 may be rolled on the receiving spool 29 and later cut and laminated to form modules. The approximate locations of the cuts yielding individual device segments during step I (FIG. 4) of the process are shown as 60 in this figure. The integrated foil 28 may be later cut, for example along lines A1-A2, to obtain segments with series connected large solar cells (in the example of FIG. 5, four large area solar cells are interconnected in each segment). The segments may be 30-300 cm in length. The segments may then be interconnected by soldering, conductive epoxy etc. to build larger area modules. Alternately, much wider substrates may be used to integrate larger numbers of large area solar cells in each segment. This way each segment may then be laminated within a protective package to form a module.

Figure 5A:
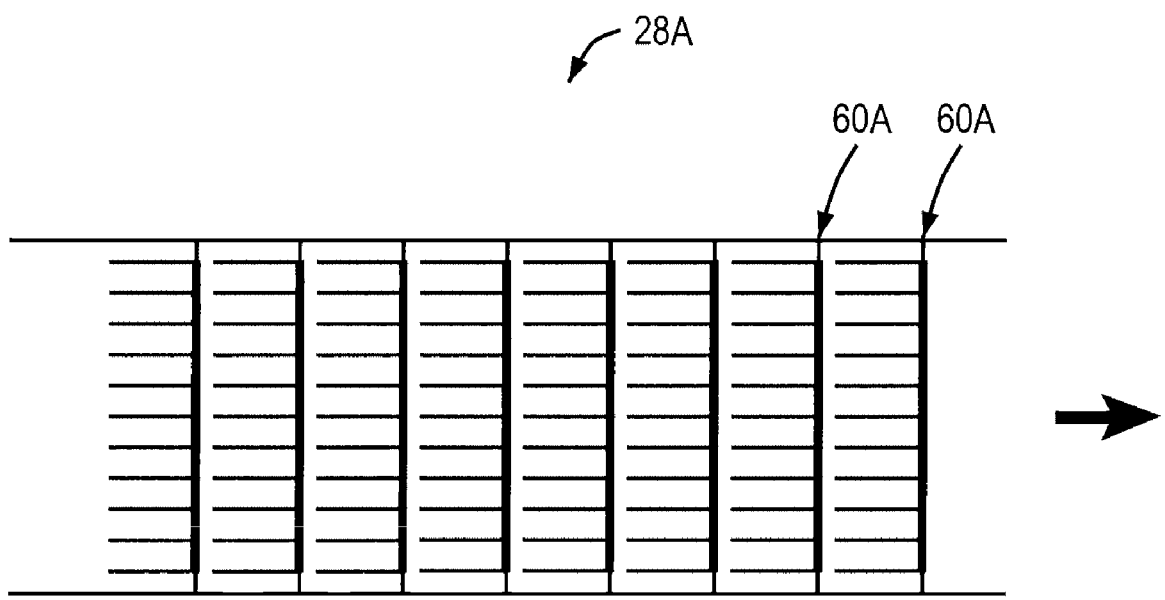

In FIG. 5, individual solar cell strips are cut out of a PV foil in a direction that is substantially parallel to the motion of the PV foil and interconnection between adjacent cells is carried out in a direction that is substantially perpendicular to the motion of the PV foil. As is shown in FIG. 5A it is also possible to form an integrated foil 28A by interconnecting the individual cells along the direction of the motion of the PV foil or the integrated foil 28A. In this case the approximate locations of the cuts yielding individual device segments during step I (FIG. 4) of the process are shown as 60A.

In another embodiment of the present invention the starting PV foil 21 of FIG. 2 may comprise only a conductive foil substrate 30, a conductive back electrode 31, a CIGS(S) absorber layer 32, and a buffer layer 33. After cutting the PV foil, attaching it onto a carrier and filling the gaps with an insulator, a transparent conductive film may be deposited. Rest of the process may then continue as described before. Since the buffer layer deposition is also a low-temperature process (typically <100° C.), it is even possible to deposit the buffer layer as well as the transparent conductive film after the cutting, attaching and gap filling operations.

Although the present invention is described with respect to certain preferred embodiments, modifications thereto will be apparent to those skilled in the art.

I claim:

1. A photovoltaic module, comprising:
    an insulating flexible carrier film having an adhesive top surface;
    a first solar cell and a second solar cell attached to the adhesive top surface of the insulating flexible carrier film, wherein a gap is maintained between the first solar cell and the second solar cell, and wherein each of the first and second solar cells comprises a flexible conductive base and a stack that comprises a CIGS(S) absorber layer and a top transparent conductive layer, such that the stack for each of the first and second solar cells is formed on the flexible conductive base of each of the first and second solar cells, and wherein top surfaces of each stack horizontally align with each other;
    an insulation structure made of an insulating material completely filling the gap separating the first cell from the second cell by extending from the bottom flexible carrier film to the top transparent conductive layers of both the first and second solar cells to form an insulating top portion of the insulating structure;
    a connector layer comprising fingers and a busbar, wherein the fingers are placed substantially on the top transparent conductive layer and the busbar is formed substantially over the insulating top portion of the insulation structure and wherein the busbar electrically connects the top transparent conductive layer of the first cell to the flexible conductive base of the second cell through a contact hole that passes through the stack of the second solar cell and is disposed in a portion of the stack of the second solar cell, the contact hole passing through both the top transparent conductive layer and the CIGS(S) absorber layer of the second solar cell; and
    a vertical cut adjacent the contact hole and which passes through the stack, including the transparent conductive layer and the CIGS(S) absorber layer, of the second solar cell to the conductive base that electrically isolates the portion with the contact hole from the top transparent conductive layer of the second solar cell.

2. The photovoltaic module of claim 1, wherein the insulating flexible carrier film comprises a polymer.

3. The photovoltaic module of claim 2, wherein the insulating flexible carrier film has a thickness in the range of 10-250 μm.

4. The photovoltaic module of claim 3, wherein the width of the gap is in the range of 10-500 μm.

5. The photovoltaic module of claim 1, wherein the base comprises a conductive foil substrate and a back electrode formed on the conductive foil substrate, wherein the conductive foil substrate comprises one of stainless steel and aluminum foil substrate, and the back electrode comprises at least one of Cr, Mo, Ta, W, Ru, Ir, and Os metals.

6. The photovoltaic module of claim 5, wherein the top transparent conductive layer comprises ZnO.

7. The photovoltaic module according to claim 1 wherein the insulation structure protrudes upwardly above the top surfaces of each stack and wherein the busbar is substantially formed over the insulating top portion of the insulation structure that protrudes upwardly above the top surfaces of each stack.

\* \* \* \* \*